(12) United States Patent
Anderson et al.

(10) Patent No.: US 10,812,100 B2
(45) Date of Patent: Oct. 20, 2020

(54) DIGITAL-TO-ANALOG CONVERTER (71) Applicant: Telefonaktiebolaget LM Ericsson (publ), Stockholm (SE)

(72) Inventors: Martin Anderson, Löddeköpinge (SE); Henrik Fredriksson, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/614,409

(22) PCT Filed: Jun. 16, 2017

(86) PCT No.: PCT/EP2017/064821
§ 371 (c)(1),
(2) Date: Nov. 18, 2019

(87) PCT Pub. No.: WO2018/228706
PCT Pub. Date: Dec. 22, 2018

(65) Prior Publication Data
US 2020/0099390 A1    Mar. 26, 2020

(51) Int. Cl.
*H03M 1/78* (2006.01)
*H03M 1/08* (2006.01)

(52) U.S. Cl.
CPC ........... *H03M 1/78* (2013.01); *H03M 1/0836* (2013.01)

(58) Field of Classification Search
CPC ....................................................... H03M 1/78
See application file for complete search history.

(56) References Cited

U.S. PATENT DOCUMENTS 3,665,458 A    5/1972  Mulkey et al.
4,028,694 A    6/1977  Cook et al.
(Continued)

FOREIGN PATENT DOCUMENTS

CN    102594353 B    4/2015

OTHER PUBLICATIONS

Balasubramaniam, H. et al., "12-bit Hybrid C2C DAC Based SAR ADC with Floating Voltage Shield", 2009 International Conference on Signals, Circuits and Systems, Jul. 15, 2009, pp. 1-5, IEEE.
(Continued)

*Primary Examiner* — Howard Williams
(74) *Attorney, Agent, or Firm* — Coats & Bennett, PLLC (57) ABSTRACT

A DAC (60) is disclosed. It comprises an input port comprising N input terminals $p_1, p_2, \ldots, p_N$ configured to receive voltages representing N input bits $b_1, b_2, \ldots, b_N$, respectively, wherein the significance of $b_j$ is higher than for $b_{j-1}$ for $j=2, 3, \ldots, N$. Furthermore, it comprises a capacitor ladder circuit (100) comprising N capacitors $C_1, C_2, \ldots, C_N$ with capacitance C, each having a first terminal and a second terminal. Capacitor $C_j$ is connected with its first terminal to the terminal $p_j$ of the input port. For each $j=1, 2, \ldots, N-1$, the capacitor ladder circuit (100) comprises a capacitor (150$_j$) with capacitance xC connected between the second terminal of capacitor $C_j$ and the second terminal of capacitor $C_{j+1}$. The DAC (60) also comprises an input circuit (140) connected to the input port comprising at least one capacitor (160$_1$-160$_N$), each connected between a unique one of the input terminals $p_1, p_2, \ldots, p_N$ of the input port and signal ground.

16 Claims, 5 Drawing Sheets (56) References Cited

U.S. PATENT DOCUMENTS

| | | | |
|---|---|---|---|
| 6,504,380 B2 * | 1/2003 | Bianchi | H03M 1/109 324/522 |
| 8,451,157 B2 | 5/2013 | Vilhonen et al. | |
| 2012/0306676 A1 | 12/2012 | Balasubramaniam et al. | |

OTHER PUBLICATIONS

Cong, L., "Pseudo C-2C Ladder-Based Data Converter Technique", IEEE Transactions on Circuits and Systems—II: Analog and Digital Signal Processing, vol. 48 No. 10, Oct. 1, 2001, pp. 927-929, IEEE.

Alpman, E., "A 7-Bit 2.5GS/sec Time-Interleaved C-2C SAR ADC for 60GHz Multi-Band OFDM-Based Receivers", Carnegie Mellon University: Carnegie Institude of Technology Thesis, Aug. 1, 2009, pp. 1-203, Carnegie Mellon University.

McCreary, J. et al., "AII-MOS Charge Redistribution Analog-to-Digital Conversion Techniques—Part I", IEEE Journals of Solid-State Circuits, vol. SC-10 No. 6, Dec. 1, 1075, pp. 371-379, IEEE.

Meinerzhagen, P., "Design of a 12-bit Low-Power SAR A/D Converter for a Neurochip", Swiss Federal Institute of Technology and University of California School of Engineering Master's Thesis, Aug. 15, 2008, pp. 1-151, Swiss Federal Institute of Technology.

* cited by examiner

DIGITAL-TO-ANALOG CONVERTER

TECHNICAL FIELD

The present invention relates to a digital-to-analog converter.

BACKGROUND

A digital-to-analog converter (DAC) is an interface circuit between the digital domain and the analog domain, and serves to convert a digital signal representation to an analog signal representation. DACs may for instance be employed in transmitter circuits, wherein signals to be transmitted are generated in the digital domain, but need to be converted to the analog domain before transmission.

Wireless communication technologies continue to evolve to meet the demand for increased data throughput. This is addressed on many levels with different approaches including higher order modulation, MIMO, scheduling, increased bandwidth, and so on. In general, higher frequencies than commonly used today, and mmW frequencies in particular, have attracted a lot of interest since there are larger blocks of continuous spectra available there, up to several GHz of bandwidth. In order to, for instance, accommodate such bandwidths while being relatively power efficient, so called capacitor ladder DACs could be chosen to implement the digital-to-analog conversion functionality in a transmitter circuit. Such a capacitor ladder structure is for instance used in U.S. Pat. No. 8,451,157 B1, which discloses a digital-to-analog upconverter that directly converts a baseband digital value comprising a plurality of bits to an RF analog signal to combine digital-to-analog operations with frequency upconversion operations.

SUMMARY

The inventors have realized an approach for implementing capacitor ladder DACs with relatively good linearity.

According to a first aspect, a DAC is provided. It comprises an input port comprising N input terminals $p_1, p_2, \ldots, p_N$ configured to receive voltages representing N input bits $b_1, b_2, \ldots, b_N$, respectively, wherein the significance of $b_j$ is higher than for $b_{j-1}$ for $j=2, 3, \ldots, N$. Furthermore, it comprises a capacitor ladder circuit comprising N capacitors $C_1, C_2, \ldots, C_N$ with capacitance C, each having a first terminal and a second terminal. Capacitor $C_j$ is connected with its first terminal to the terminal $p_j$ of the input port. For each $j=1, 2, \ldots, N-1$, the capacitor ladder circuit comprises a capacitor with capacitance xC connected between the second terminal of capacitor $C_j$ and the second terminal of capacitor $C_{j+1}$. The DAC also comprises an input circuit connected to the input port comprising at least one capacitor, each connected between a unique one of the input terminals $p_1, p_2, \ldots, p_N$ of the input port and signal ground.

In some embodiments, the input circuit consists of N capacitors.

In other embodiments, the input circuit consists of M<N capacitors. For example, the M capacitors of the input circuit may be connected to the input terminals $p_{N-M}$ to $p_{N-1}$. The DAC may comprise a capacitor with capacitance xC/2 connected between the second terminal of capacitor $C_1$ and signal ground.

The input bits $b_j$ may be binary weighted.

In some embodiments, x=2. In some other embodiments, $x=2\alpha$, wherein $\alpha>1$.

The DAC may comprise a load capacitor connected to the second terminal of capacitor $C_N$, which is an output of the DAC.

The input port may comprise K additional input terminals configured to receive voltages representing K thermometer coded input bits, each more significant than $b_N$.

The DAC may comprise a capacitor with capacitance xC connected between an output of the DAC and the second terminal of capacitor $C_N$.

The DAC may comprise a capacitor bank with K capacitors, each connected between a unique one of the additional input terminals and the output of the DAC, and having capacitance C.

According to a second aspect, there is provided an electronic apparatus comprising the DAC according to the first aspect. The electronic apparatus may be a communication apparatus, for instance a wireless device or base station for a cellular communications system.

Further embodiments are defined in the dependent claims. It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of embodiments of the invention will appear from the following detailed description, reference being made to the accompanying drawings, in which.

DETAILED DESCRIPTION

Figure 1:
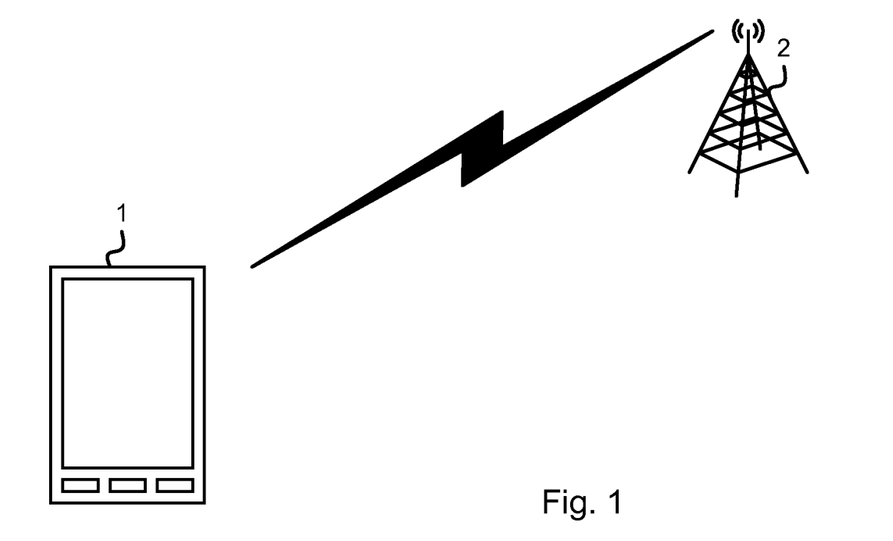
FIG. 1 illustrates a communication environment.

FIG. 1 illustrates a communication environment wherein embodiments of the present invention may be employed. A wireless device 1 of a cellular communications system is in wireless communication with a radio base station 2 of the cellular communications system. The wireless device 1 may be what is generally referred to as a user equipment (UE). The wireless devices 1 is depicted in FIG. 1 as a mobile phone, but may be any kind of device with cellular communication capabilities, such as a tablet or laptop computer, machine-type communication (MTC) device, or similar. Furthermore, a cellular communications system is used as an example throughout this disclosure. However, embodiments of the present invention may be applicable in other types of systems as well, such as but not limited to WiFi systems.

The radio base station 2 and wireless device 1 are examples of what in this disclosure is generically referred to as communication apparatuses. Embodiments are described below in the context of a communication apparatus in the form of the radio base station 2 or wireless device 1. However, other types of communication apparatuses can be considered as well, such as a WiFi access point or WiFi enabled device. Furthermore, embodiments of DACs described herein may be used in other types of electronic apparatuses than communication apparatuses as well.

Figure 2:
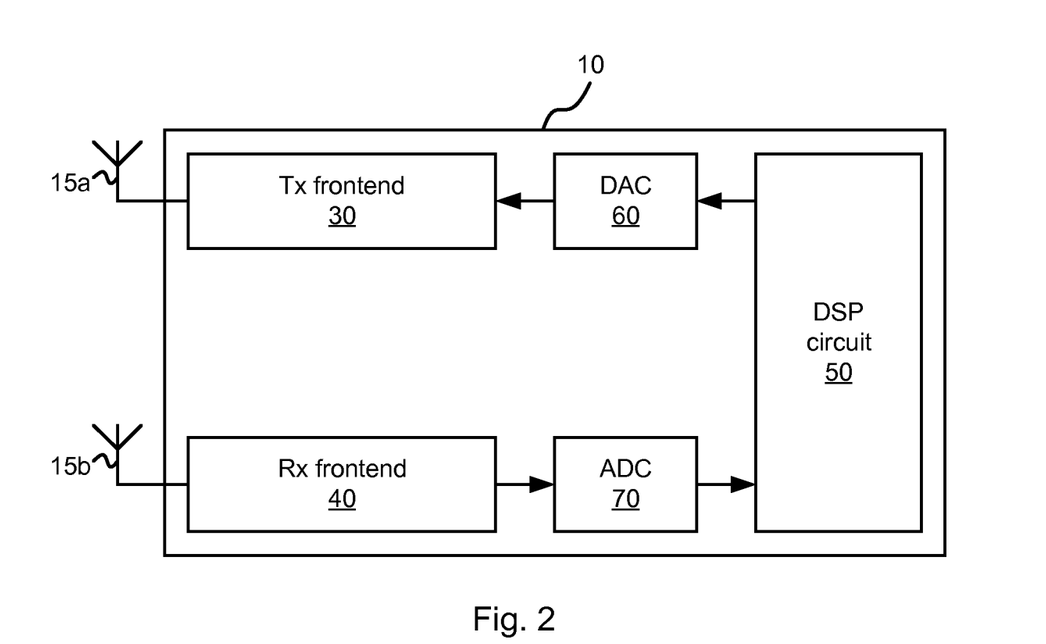
FIG. 2 illustrates a transceiver circuit.

FIG. 2 illustrates a simplified block diagram of a transceiver circuit 10, which may e.g. be comprised in any of the communication apparatuses 1 or 2. In FIG. 2, the transceiver circuit 10 is configured to transmit signals via a transmit antenna 15a and receive signals via a receive antenna 15b. It should be noted that this is merely an example. Various other antenna arrangements are possible as well, including multiple transmit or receive antennas, or one or more shared transmit and receive antennas. Furthermore, in FIG. 2, the transceiver circuit comprises a transmitter frontend circuit 30, connected to the transmit antenna 15a, and a receiver frontend circuit 40, connected to the receive antenna 15b. Moreover, in FIG. 2, the transceiver circuit 10 comprises a digital signal processing (DSP) circuit 50, such as a baseband processor. The DSP circuit 50 is configured to generate signals to be transmitted and process received signals in the digital domain. The transceiver circuit 10 further comprises a DAC 60 configured to convert signals to be transmitted generated by the DSP circuit 50 from a digital to an analog representation, and provide the analog representation to the transmitter frontend 30 for transmission. Moreover, the transceiver circuit 10 comprises an analog-to-digital converter (ADC) 70 configured to convert signals received via the receiver frontend 40 from an analog to a digital representation and provide the digital representation to the DSP circuit 50 for processing therein.

Figure 3:
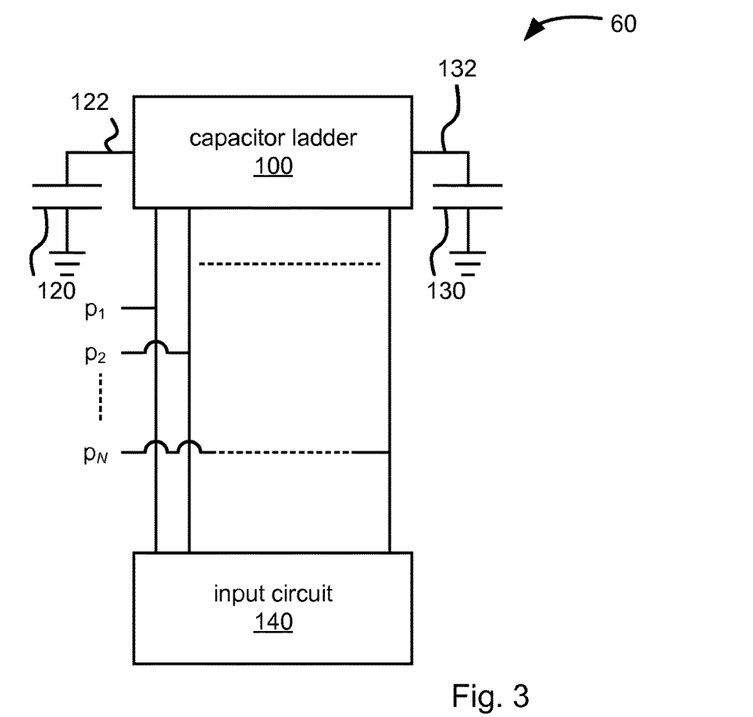
FIGS. 3-12 show circuit diagrams.

FIG. 3 is circuit diagram of the DAC 60 according to some embodiments. The DAC 60 comprises an input port comprising N input terminals $p_1, p_2, \ldots, p_N$ configured to receive voltages representing N input bits $b_1, b_2, \ldots, b_N$, respectively. In this disclosure, the convention is used that the significance of $b_j$ is higher than for $j=2, 3, \ldots, N$. That is, $b_1$ has the least significance, or weight, and $b_N$ has the highest significant, or weight, of the input bits $b_1, b_2, \ldots, b_N$. Furthermore, the DAC 60 comprises a capacitor ladder circuit 100, further described below with reference to FIG. 4. As illustrated in FIG. 3, the capacitor ladder circuit 100 may have terminals 122 and 132. In FIG. 3, the DAC 60 comprises a capacitor 120 connected between the terminal 122 and signal ground. Furthermore, in FIG. 3, the DAC 60 comprises a capacitor 130. The capacitor 130 may be connected to an output node of the DAC 60. In FIG. 3, it is connected to the terminal 132 of the capacitor ladder circuit 100, which (i.e. the terminal 132) for this embodiment serves as an output of the DAC 60. The other end of the capacitor 130 may e.g. be connected to signal ground as illustrated in FIG. 3.

The inventors have realized that the linearity of a capacitor ladder DAC can be improved by means of an input circuit 140, included in the embodiment of FIG. 3, connected to the input port. Embodiments of the input circuit 140 are further described below with reference to FIGS. 5-10.

Figure 4:
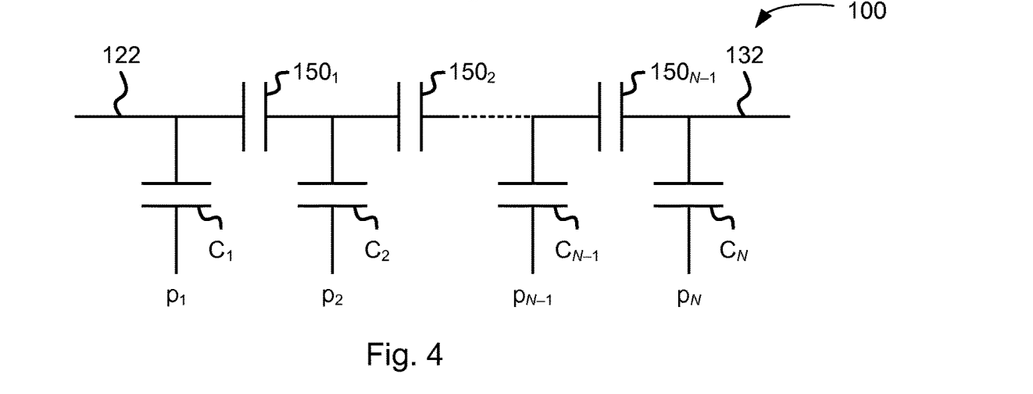

FIG. 4 shows an embodiment of the capacitor ladder circuit 100. It comprises N capacitors $C_1, C_2, \ldots, C_N$ with capacitance C, each having a first terminal and a second terminal. The value of the capacitance C is a design parameter which can be selected from application to application based on application requirements. This would be a straightforward task for a person skilled in the art of data converter design. Furthermore, for each $j=1, 2, \ldots, N$, the capacitor $C_j$ is connected with its first terminal to the terminal $p_j$ of the input port. Moreover, for each $j=1, 2, \ldots, N-1$, the capacitor ladder circuit 100 comprises a capacitor $150_j$ with capacitance xC connected between the second terminal of capacitor $C_j$ and the second terminal of capacitor $C_{j+1}$. This kind of ladder topology can be referred to as a C-xC capacitor ladder. A fairly common choice of the factor x is 2, resulting in a so called C-2C capacitor ladder, which is suitable for use with a binary-weighted input. This is used in some embodiments. However, in other embodiments, a factor x other than 2 is used, as is described further below. In FIG. 3, the second terminal of capacitor $C_1$ is connected to the terminal 122, and the second terminal of capacitor $C_N$ is connected to the terminal 132. According to some embodiments, the capacitor 120 has the capacitance xC/2.

A problem that the inventors have identified with the capacitor ladder structure 100, which is particularly problematic for higher frequencies, is that the responses, such as impulse or step responses, from the different terminals $p_1, p_2, \ldots, p_N$ to the output of the DAC 60 are different, and not just by magnitude scaling factors reflecting the weight difference between the different bits $b_1, b_2, \ldots, b_N$, but there are also phase, or delay, differences. Just considering the schematic in FIG. 4, it may seem that there are no delays at all in the circuit. However, finite nonzero output impedances of the circuits driving the input terminals $p_1, p_2, \ldots, p_N$, resistances in wires, etc., results in that charge redistribution between capacitors is not instantaneous. The differences in responses from the different input terminals $p_1, p_2, \ldots, p_N$ to the output of the DAC 60 results in an overall nonlinear response from digital input to analog output. This nonlinearity is dynamic, or frequency dependent, and gets more severe as signal and sampling frequencies increase.

Embodiments of the input circuit 140 disclosed herein enable a reduction of this nonlinearity problem by equalizing, or reducing the difference between, the delays of the responses from different input terminals $p_1, p_2, \ldots, p_N$ to the output of the DAC 60, at least for some of the input terminals $p_1, p_2, \ldots, p_N$.

FIGS. 5-10 illustrate various embodiments of the input circuit 140. According to the embodiments, the input circuit 140 comprising at least one capacitor $160_1$-$160_N$, each connected between a unique one of the input terminals $p_1, p_2, \ldots, p_N$ of the input port and signal ground. In the figures, there is a correspondence between the indices of the reference signs for the capacitors $160_1$-$160_N$ and for the input terminals $p_1, p_2, \ldots, p_N$, such that capacitor $160_j$ (if it exists) is connected to the input terminal $p_j$. This convention is used throughout this disclosure.

Figure 5:
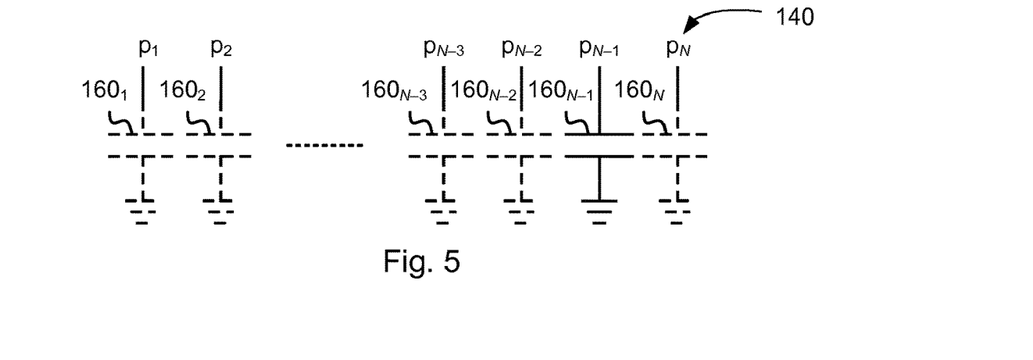

For some applications, the difference between the response from the input $p_{N-1}$ and the response from the input $p_N$ is the most crucial to reduce, e.g. since the weights of the corresponding bits $b_{N-1}$ and $b_N$ are the highest, and therefore this difference has the most impact on the output signal. According to some embodiments, the input circuit 140 at least comprises the capacitor $160_{N-1}$ connected to the input terminal $p_{N-1}$, as illustrated in FIG. 5. This facilitates equalizing the delays of the responses from the input terminals $p_{N-1}$ and $p_N$ to the output of the DAC 60. Also illustrated in FIG. 5 is that some of these embodiments of the input circuit 140 may optionally comprise one or more of capacitors $160_1$-$160_{N-2}$, $160_N$ connected to $p_1$-$p_{N-2}$, $p_N$, respectively.

According to some embodiments, the input circuit 140 consists of M<N capacitors $160_i$. For example, it may be a single capacitor, such as capacitor $160_{N-1}$, as discussed with reference to FIG. 5. However, M may also be higher than 1 in some embodiments.

Figure 6:
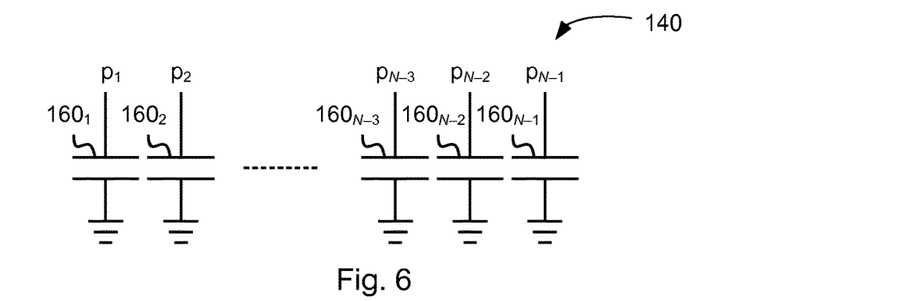
Figure 7:
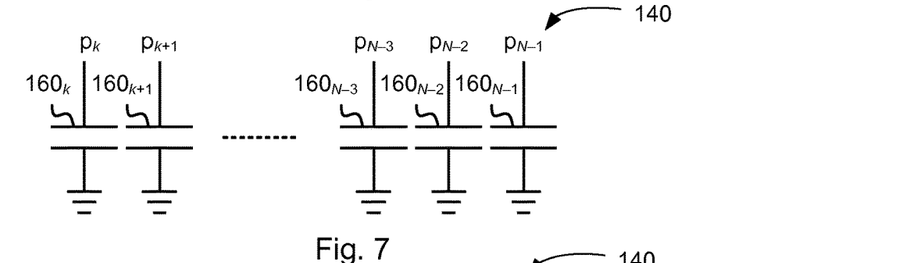
Figure 8:
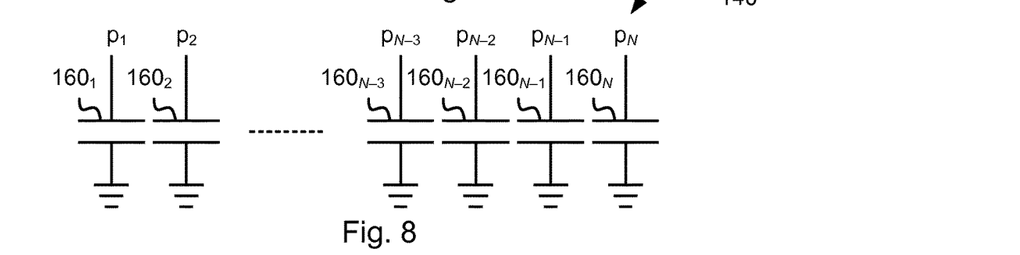
Figure 9:
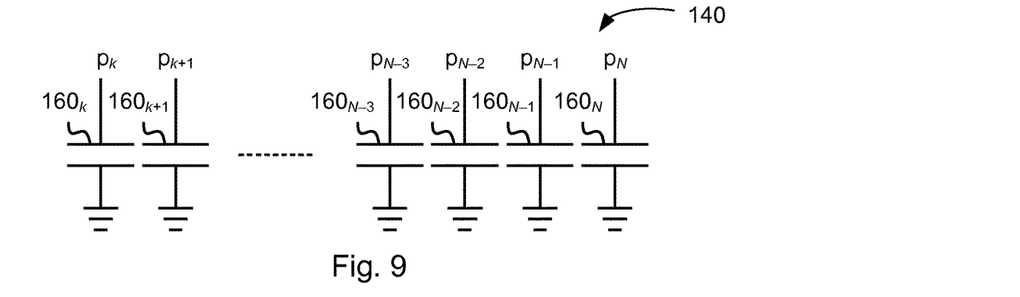

In some embodiments, the M capacitors $160_i$ of the input circuit 140 are connected to the input terminals $p_{N-M}$ to $p_{N-1}$. This facilitates equalizing the delays of the M+1 responses from the input terminals $p_{N-M}$ to $p_N$ to the output of the DAC 60. The corresponding bits $b_{N-M}$ to $b_N$ are the M+1 bits with the highest weights and therefore these delays are likely those that are most important to equalize. FIG. 6 illustrates an embodiment where M=N-1, which enables equalizing the delays of the responses from all the input terminals. FIG. 7 illustrates a more generic embodiment where M=N−k for some integer k, 1≤k≤N−1. Although embodiments of the input circuit 140 have been described above without any capacitor $160_N$ connected to the input terminal $p_N$, some embodiments may well include said capacitor $160_N$. Examples are shown in FIG. 8 and FIG. 9, which correspond to the embodiments in FIG. 6 and FIG. 7, respectively, but with the capacitor $160_N$ included as well. FIG. 8 illustrates an embodiment wherein the input circuit 140 comprises of N capacitors $160_1$-$160_N$, connected to $p_1$-$p_N$, respectively. FIG. 9 illustrates a more generic embodiment, where the input circuit comprises N−k+1 capacitors $160_k$-$160_N$ connected to $p_k$-$p_N$, respectively, for some integer k, 1≤k≤N−1.

Figure 10:
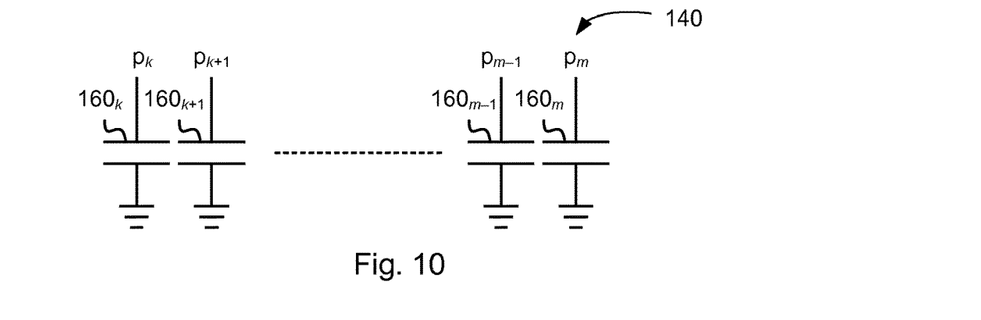

FIG. 10 illustrates a generic embodiment of the input circuit 140 with capacitors $160k$-$160m$ for some integers k and m, 1≤k≤N−1, k≤m≤N, which can e.g. represent any of the embodiments illustrated in FIGS. 6-9 given proper selection of k and m.

The bits $b_j$ together represent a number $X=X_0+\Sigma_{j=1}^{N}b_jw_j$, where the weights $w_j$ and the constant $X_0$ depend on the number range and system used. According to some embodiments, the input bits $b_j$ are binary weighted. That is, the weight $w_j$ of the bit is given by some constant, below denoted $w_0$, times $2^j$, i.e. $w_j=w_0 2^j$. Some such embodiments utilize the so called C-2C capacitor ladder structure mentioned above, where the factor x=2. However, the inventors have realized that parasitic capacitance on the interconnecting nodes between the capacitors $C_1$-$C_N$ and $150_1$-$150_{N-1}$ (FIG. 4) may cause a nonlinear behavior. Furthermore, the inventors have realized that this nonlinear behavior can be counteracted by selecting a value of x other than 2. In the following discussion, x=2α, where α>1. A suitable value of α to get a required degree of linearity can be selected by means of simulation. A good starting point for the value of alpha can be selected based on the following discussion. Assume that the capacitance between the two plates of a capacitor is $C_{plate}$, and that from each terminal of the capacitor there is a parasitic capacitance $C_{par}$ to ground. We further define the parameter $\gamma=C_{par}/C_{plate}$. Assuming that each capacitor is designed such that they all have the same value of γ, it can be shown that selecting α=1/(1−2γ) effectively counteracts, or avoids, the nonlinearity due to the parasitic capacitance.

In FIG. 3, the DAC 60 comprises the load capacitor 130 connected to the second terminal of capacitor $C_N$, denoted node 132, which in that embodiment is an output of the DAC 60.

Figure 11:
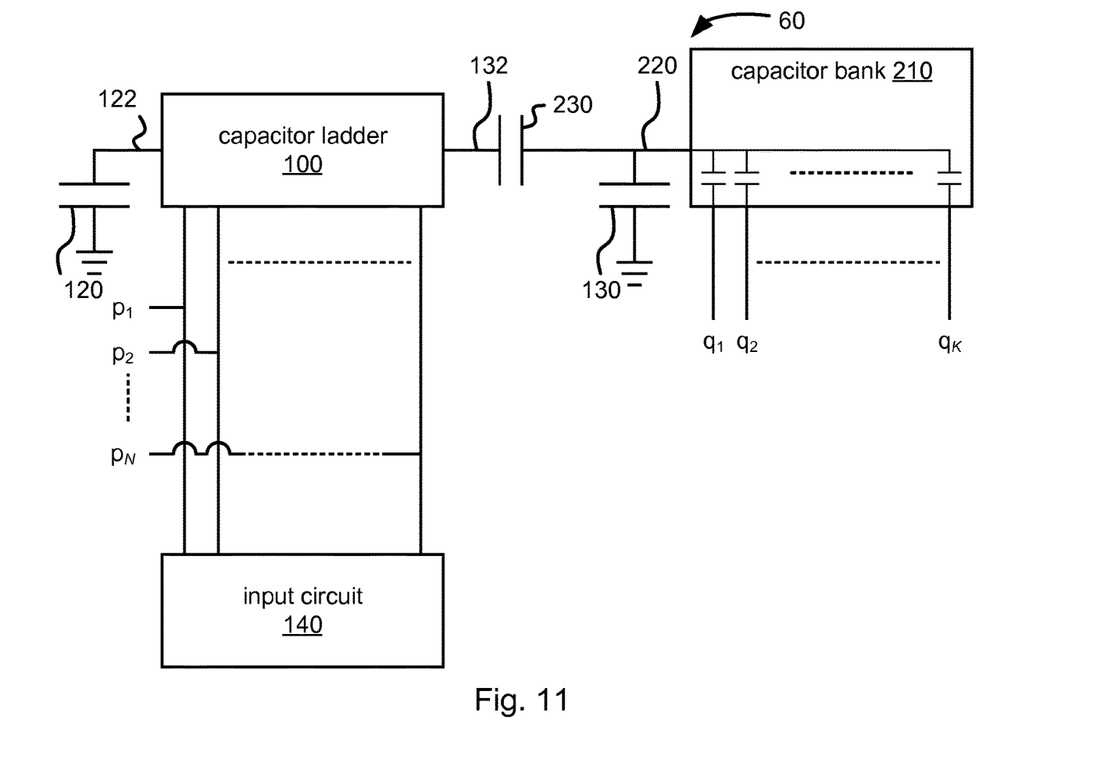

In other embodiments, the wherein the input port may comprise K additional input terminals $q_1, \ldots, q_K$ configured to receive voltages representing K additional input bits, each more significant than $b_N$. These additional bits may e.g. be thermometer coded bits, resulting in an overall DAC topology known as a segmented topology. This is illustrated in FIG. 11. A capacitor 230 with capacitance xC is connected between an output, in this case labeled 220, of the DAC 60 and the second terminal of capacitor $C_N$ (i.e. node 132). The load capacitor 130 is in this case connected to the node 220. Furthermore, it comprises a capacitor bank 210. As illustrated in FIG. 11, the capacitor bank may comprise K capacitors, each connected between a unique one of the additional input terminal $q_1, \ldots, q_K$ and the output 220 of the DAC 60. Each of said capacitors of capacitor bank 210 may have capacitance C. It should be noted that if an x other than 2 is used, e.g. x=2α, where α>1, reference voltages used for representing the bits at the inputs $q_1, \ldots, q_K$ may have to be different from those used at the inputs $p_1, \ldots, p_N$, in order to obtain a desired transfer characteristic of the DAC 60. Proper values for the reference voltages may be obtained by means of simulation. A suitable starting point may be to use a reference voltage $V_{ref1}$ at the inputs $p_1, \ldots, p_N$ and a reference voltage $V_{ref2}$ at the inputs $q_1, \ldots, q_K$, where $V_{ref1} \cong \alpha V_{ref2}$.

Figure 12:
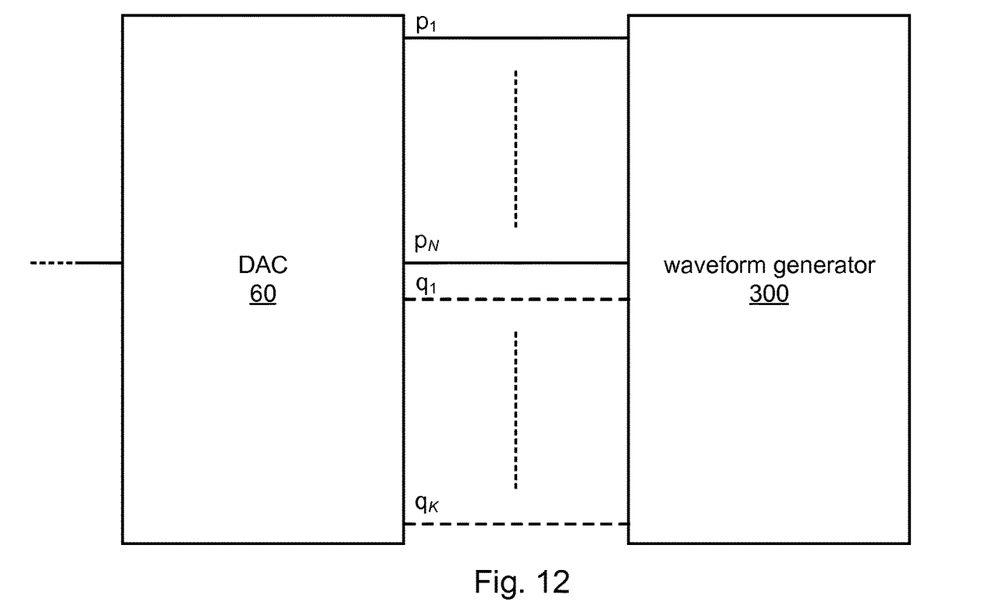

FIG. 12 illustrates the DAC 60 together with a waveform generator 300 configured to generate the input voltages to the input terminals $p_1, \ldots, p_N$ (and, where applicable, the input voltages to the input terminals $q_1, \ldots, q_K$). The waveform generator 300 may e.g. be included in the transceiver circuit 10 and/or electronic apparatus 1,2, for instance implemented on the same integrated circuit as the DAC 60.

Figure 13:
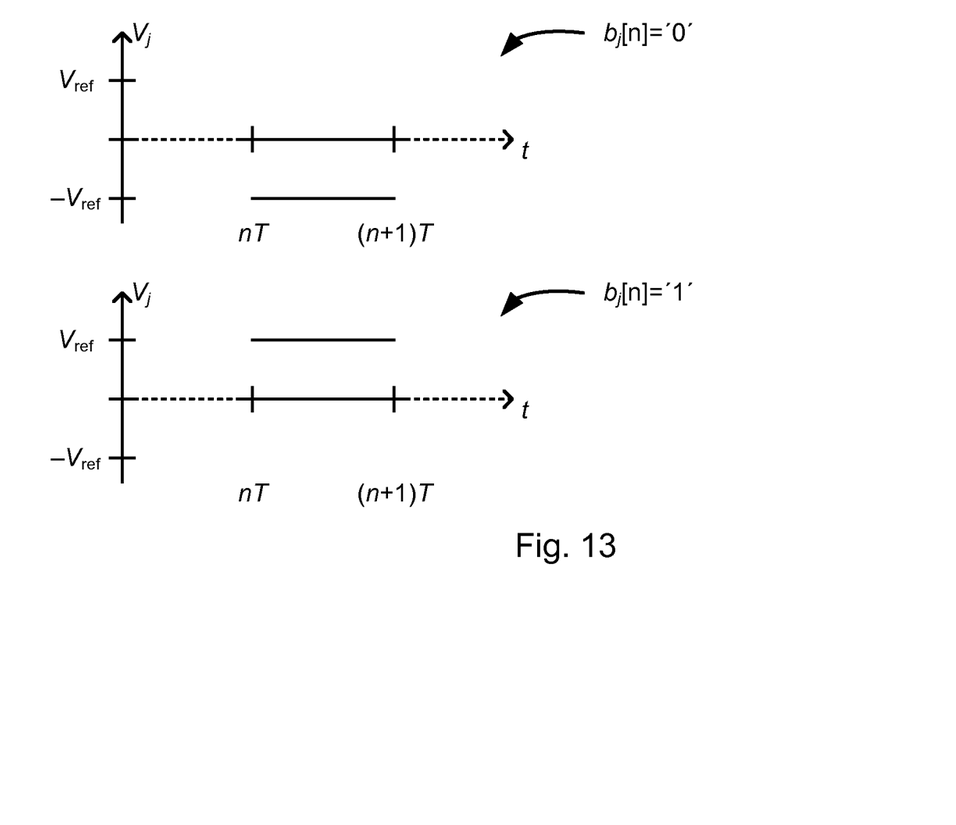
FIGS. 13-14 show signal waveforms.
Figure 14:
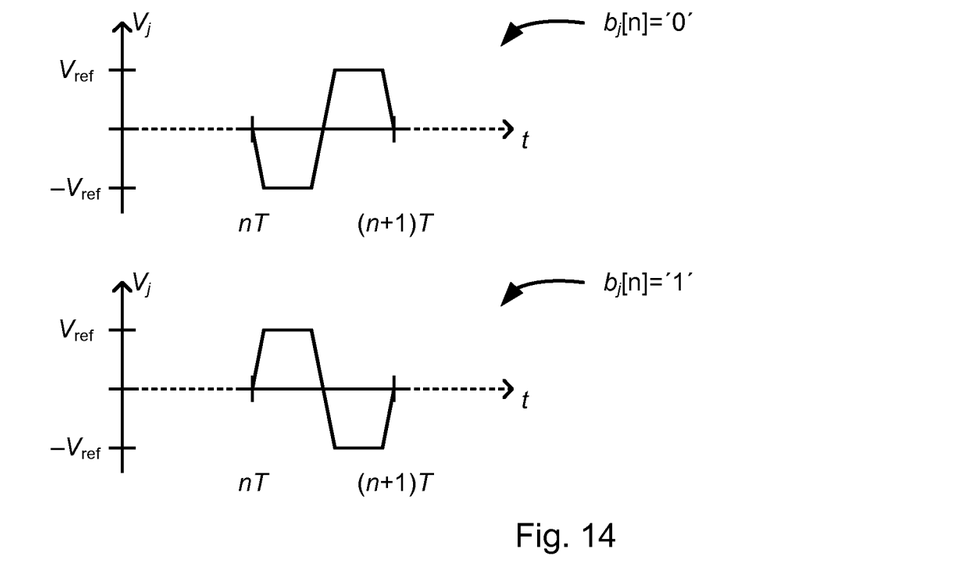

FIGS. 13-14 illustrate sketches of example waveforms generated by the waveform generator 300 according to different embodiments. The plots depict waveforms for the bit $b_j[n]$ during the time interval nT≤t<(+1)T, wherein t denotes time, n is a sequence index, and T is a sample period. FIG. 13 illustrates an embodiment where the DAC 60 is a baseband DAC. Then, when $b_j[n]$='0', the waveform is at $-V_{ref}$ during the depicted time interval, otherwise, i.e. if $b_j[n]$='1', the waveform is at $V_{ref}$ during the depicted time interval. FIG. 14 illustrates an embodiment where the DAC 60 is an upsampling DAC, similar to that disclosed in U.S. Pat. No. 8,451,157 B1 mentioned in the background section. When $b_j[n]$='0', the waveform is an oscillating waveform between $-V_{ref}$ and $V_{ref}$ during the depicted time interval. If $b_j[n]$='1', the waveform is inverted compared with when $b_j[n]$='0'. The example in FIG. 14 shows a single oscillation period of the waveform during the sample period T. However, depending on the desired output frequency band, the waveform may have multiple oscillation periods during a single sample period T. It should be noted that, for a segmented DAC 60 as illustrated in FIG. 11, reference voltages $V_{ref}$ used for representing the bits at the inputs $q_1, \ldots, q_K$ may have to be different from those used at the inputs $p_1, \ldots, p_N$, in order to obtain a desired transfer characteristic of the DAC 60 if an x other than 2 is used in the capacitor ladder 100, for instance x=2α, where α>1. Proper values for the reference voltages may be obtained by means of simulation. A suitable starting point may be to use a reference voltage $V_{ref}=V_{ref1}$ at the inputs $p_1, \ldots, p_N$ and a reference voltage $V_{ref}=V_{ref2}$ at the inputs $q_1, \ldots, q_K$, where $V_{ref1} \cong \alpha V_{ref2}$.

The present invention has been described above with reference to specific embodiments. However, other embodiments than the above described are possible within the scope of the invention. Different method steps than those described above, performing the method by hardware or software, may be provided within the scope of the invention. The different features and steps of the embodiments may be combined in other combinations than those described.

The invention claimed is:

1. A digital-to-analog converter (DAC), comprising:
   an input port comprising N input terminals $p_1, p_2, \ldots, p_N$ configured to receive voltages representing N input bits $b_1, b_2, \ldots, b_N$, respectively, wherein the significance of $b_1$ is higher than for $b_{j-1}$ for j=2, 3, . . . , N;
   a capacitor ladder circuit comprising N capacitors $C_1, C_2, \ldots, C_N$ with capacitance C, each having a first terminal and a second terminal; wherein capacitor $C_j$ is connected with its first terminal to the terminal $p_j$ of the input port; and wherein for each j=1, 2, . . . , N−1, the capacitor ladder circuit comprises a capacitor with capacitance xC connected between the second terminal of capacitor $C_j$ and the second terminal of capacitor $C_{j+1}$; and an input circuit connected to the input port comprising at least one capacitor, each connected between a unique one of the input terminals of the input port and signal ground.

2. The DAC of claim 1, wherein the input circuit consists of N capacitors.

3. The DAC of claim 1, wherein the input circuit consists of M<N capacitors.

4. The DAC of claim 3, wherein the M capacitors of the input circuit are connected to the input terminals $p_{N-M}$ to $p_{N-1}$.

5. The DAC of claim 1, further comprising a capacitor with capacitance xC/2 connected between the second terminal of capacitor $C_1$ and signal ground.

6. The DAC of claim 1, wherein the input bits are binary weighted.

7. The DAC of claim 6, wherein x=2.

8. The DAC of claim 6, wherein x=2α, wherein α>1.

9. The DAC of claim 1, further comprising a load capacitor connected to the second terminal of capacitor $C_N$, which is an output of the DAC.

10. The DAC of claim 1, wherein the input port comprises K additional input terminals ($q_1, \ldots, q_K$) configured to receive voltages representing K thermometer coded input bits, each more significant than $b_N$.

11. The DAC of claim 10, further comprising a capacitor with capacitance xC connected between an output of the DAC and the second terminal of capacitor $C_N$.

12. The DAC of claim 11, further comprising a capacitor bank with K capacitors, each connected between a unique one of the additional input terminals ($q_1, \ldots, q_K$) and the output of the DAC, and having capacitance C.

13. An electronic apparatus,
a digital-to-analog converter (DAC), wherein the DAC comprises:
an input port comprising N input terminals $p_1$, $p_2, \ldots, p_N$ configured to receive voltages representing N input bits $b_1, b_2, \ldots, b_N$, respectively, wherein the significance of $b_j$ is higher than for $b_{j-1}$ for j=2, 3, \ldots, N;
a capacitor ladder circuit comprising N capacitors $C_1$, $C_2, \ldots, C_N$ with capacitance C, each having a first terminal and a second terminal; wherein capacitor $C_1$ is connected with its first terminal to the terminal $p_1$ of the input port; and wherein for each j=1, 2, \ldots, N−1, the capacitor ladder circuit comprises a capacitor with capacitance xC connected between the second terminal of capacitor $C_j$ and the second terminal of capacitor $C_{j+1}$; and
an input circuit connected to the input port comprising at least one capacitor, each connected between a unique one of the input terminals of the input port and signal ground.

14. The electronic apparatus of claim 13, wherein the electronic apparatus is a communication apparatus.

15. The electronic apparatus of claim 14, wherein the communication apparatus is a wireless device for a cellular communications system.

16. The electronic apparatus of claim 14, wherein the communication apparatus is a base station for a cellular communications system.

* * * * *